(12) United States Patent
Lin et al.

(10) Patent No.: US 8,071,437 B2
(45) Date of Patent: Dec. 6, 2011

(54) METHOD OF FABRICATING EFUSE, RESISTOR AND TRANSISTOR

(75) Inventors: Yung-Chang Lin, Tai-Chung Hsien (TW); Kuei-Sheng Wu, Tainan County (TW); Chang-Chien Wong, Tainan County (TW); Ching-Hsiang Tseng, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 203 days.

(21) Appl. No.: 12/621,518

(22) Filed: Nov. 19, 2009

(65) Prior Publication Data

US 2011/0117710 A1 May 19, 2011

(51) Int. Cl.
*H01L 21/8234* (2006.01)
(52) U.S. Cl. ........ 438/238; 438/132; 438/281; 438/381; 438/384; 257/408; 257/E21.438; 257/E21.444
(58) Field of Classification Search .................. 438/210, 438/215, 238, 281, 381, 384, 132; 257/408, 257/529, E21.438, E21.444
See application file for complete search history.

(56) References Cited

U.S. PATENT DOCUMENTS

| | | | | |
|---|---|---|---|---|
| 5,047,826 A | * | 9/1991 | Keller et al. | 257/379 |
| 5,457,062 A | * | 10/1995 | Keller et al. | 438/202 |
| 5,821,160 A | * | 10/1998 | Rodriguez et al. | 438/601 |
| 2006/0102964 A1 | | 5/2006 | Huang | |
| 2009/0101989 A1 | | 4/2009 | Chen et al. | |
| 2010/0237435 A1 | * | 9/2010 | Chudzik et al. | 257/380 |
| 2010/0320509 A1 | * | 12/2010 | Knorr et al. | 257/288 |
| 2010/0320561 A1 | * | 12/2010 | Xia et al. | 257/529 |
| 2010/0328022 A1 | * | 12/2010 | Fan et al. | 338/309 |
| 2011/0057267 A1 | * | 3/2011 | Chuang et al. | 257/380 |
| 2011/0215321 A1 | * | 9/2011 | Booth et al. | 257/49 |

OTHER PUBLICATIONS

Takaoka, A Novel Via-fuse Technology Featuring Highly Stable Blow Operation with Large On-off Ratio for 32nm Node and Beyond, Electron Devices Meeting, 2007. IEDM 2007. IEEE International, p. 43-46, Location: Washington, DC, Dec. 10, 2007.

* cited by examiner

*Primary Examiner* — Mary Wilczewski
*Assistant Examiner* — Toniae Thomas
(74) *Attorney, Agent, or Firm* — Winston Hsu; Scott Margo

(57) ABSTRACT

A method of fabricating an efuse, a resistor and a transistor includes the following steps: A substrate is provided. Then, a gate, a resistor and an efuse are formed on the substrate, wherein the gate, the resistor and the efuse together include a first dielectric layer, a polysilicon layer and a hard mask. Later, a source/drain doping region is formed in the substrate besides the gate. After that, the hard mask in the resistor and the efuse is removed. Subsequently, a salicide process is performed to form a silicide layer on the source/drain doping region, the resistor, and the efuse. Then, a planarized second dielectric layer is formed on the substrate and the polysilicon in the gate is exposed. Later, the polysilicon in the gate is removed to form a recess. Finally a metal layer is formed to fill up the recess.

8 Claims, 11 Drawing Sheets

US 8,071,437 B2

METHOD OF FABRICATING EFUSE, RESISTOR AND TRANSISTOR

BACKGROUND OF THE INVENTION

1. Field of the Invention

The present invention relates to a method of making a metal gate transistor, a resistor and an efuse.

2. Description of the Prior Art

As semiconductors become smaller and more complex, semiconductor components are more easily influenced by impurities. If a single metal link, a diode, or a MOS is broken, the whole chip will be unusable. To tackle this problem, efuses can be selectively formed for increasing the yield of IC manufacturing.

An efuse typically includes a cathode, an anode and an efuse body. A plurality of contact plugs are formed to connect to the cathode and the anode. The efuse body consists of a polysilicon layer and a silicide layer.

To increase the performance of transistors, metal gates are popularly used in the semiconductor field. Metal gates with low resistance replace the traditional polysilicon gates. The metal gates are usually formed by the gate-last process.

Additionally, resistors are elements which are often used for providing regulated voltage and for filtering noise in a circuit. The resistors generally include polysilicon and silicide layers.

In the current semiconductor field, fabricating processes are being improved with the aim of reaching high yields. Integrated manufacturing methods of semiconductor devices are also important to decrease the fabricating steps and thereby increase yield. An integrated method for fabricating a metal gate transistor, a resistor and an efuse is needed.

SUMMARY OF THE INVENTION

In light of the above, the first embodiment of the present invention provides a method of fabricating an efuse, a resistor and a transistor. First, a substrate is provided. Then, a transistor gate, a resistor, and an efuse are formed on the substrate, wherein the transistor gate, the resistor and the efuse together comprise a first dielectric layer, a polysilicon layer, a hard mask. A source/drain doping region is formed in the substrate near the transistor gate. The hard mask in the resistor and in the efuse is removed. Subsequently, a salicide process is performed to form a silicide layer in the source/drain doping region, the resistor and the efuse respectively. Next, a planarized second dielectric layer is formed on the substrate, and the polysilicon in the transistor gate, the resistor and the efuse are exposed. Then, the polysilicon in the transistor gate is removed to form a recess. Finally, a metal layer is formed to fill up the recess.

The second embodiment of the present invention provides another method of fabricating an efuse, a resistor and a transistor. First, a substrate is provided. Next, a transistor gate, a resistor, and an efuse on the substrate are formed, wherein the transistor gate, the resistor and the efuse together comprise a first dielectric layer, a polysilicon layer, a hard mask. A source/drain doping region in the substrate near the transistor gate is formed. A first silicide layer in the source/drain doping region is formed. Subsequently, a second dielectric layer on the substrate, the transistor gate, the resistor, the efuse and the source/draining doping region, respectively, is formed. Then, the second dielectric layer is planarized and the polysilicon in the transistor gate, the polysilicon in the resistor and the polysilicon in the efuse is exposed. The polysilicon in the transistor gate is removed to form a recess. A metal layer fills up the recess. Finally, a second silicide layer is formed on the resistor and the efuse respectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
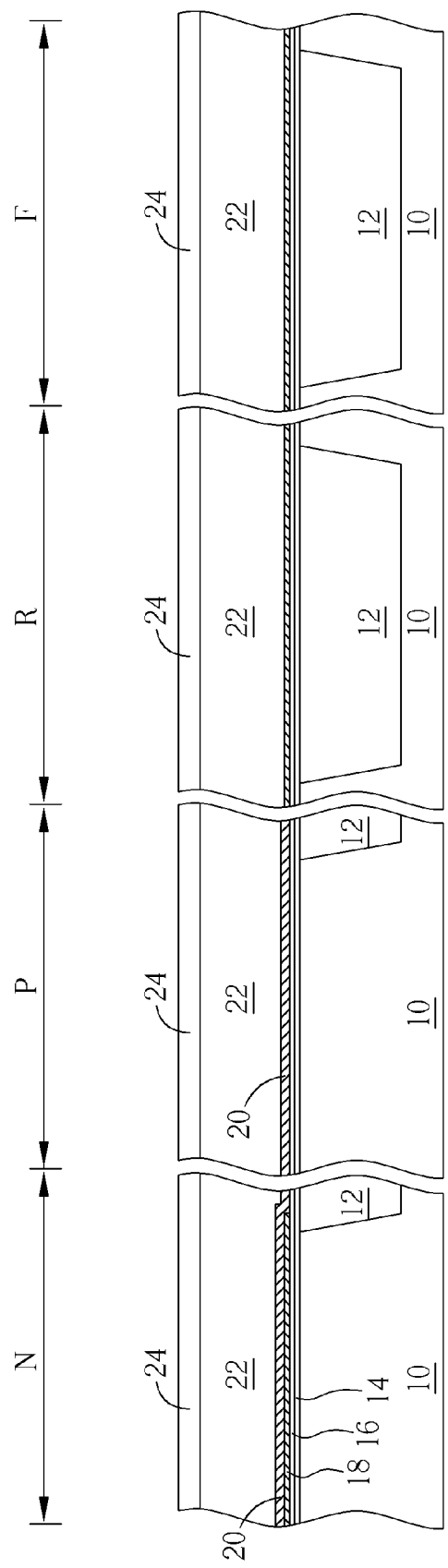
FIG. 1 to FIG. 6 depict a method of fabricating an efuse, a resistor and a transistor schematically according to the first preferred embodiment of the present invention.

FIG. 1 to FIG. 6 depict a method of fabricating an efuse, a resistor and a transistor schematically according to the first preferred embodiment of the present invention. First, as shown in FIG. 1, a substrate 10 is provided. The substrate 10 has an N-type transistor region N, a P-type transistor region P, a resistor region R and an efuse region F. An STI 12 is disposed in the N-type transistor region N, the P-type transistor region P, the resistor region R and the efuse region F, respectively.

Then, a dielectric layer 14 and a high-K material layer 16 are formed on the N-type transistor region N, the P-type transistor region P, the resistor region R and the efuse region F in sequence. A capping layer 18 is formed on the N-type transistor region N, the resistor region R and the efuse region F. A work function metal layer 20 such as titanium nitride is formed blankly on the capping layer 18 in the N-type transistor region N, the resistor region R and the efuse region F. The work function metal layer 20 is also formed on the high-K material layer 16 in the P-type transistor region P. The work function metal layer 20 in the resistor region R and the efuse region F is removed by an etching process. Subsequently, a polysilicon layer 22 and a hard mask 24 are formed in sequence to cover the work function metal layer 20 in the N-type transistor region N and the P-type transistor region P, and cover the capping layer 18 in the resistor region R and in the efuse region F.

Figure 2:
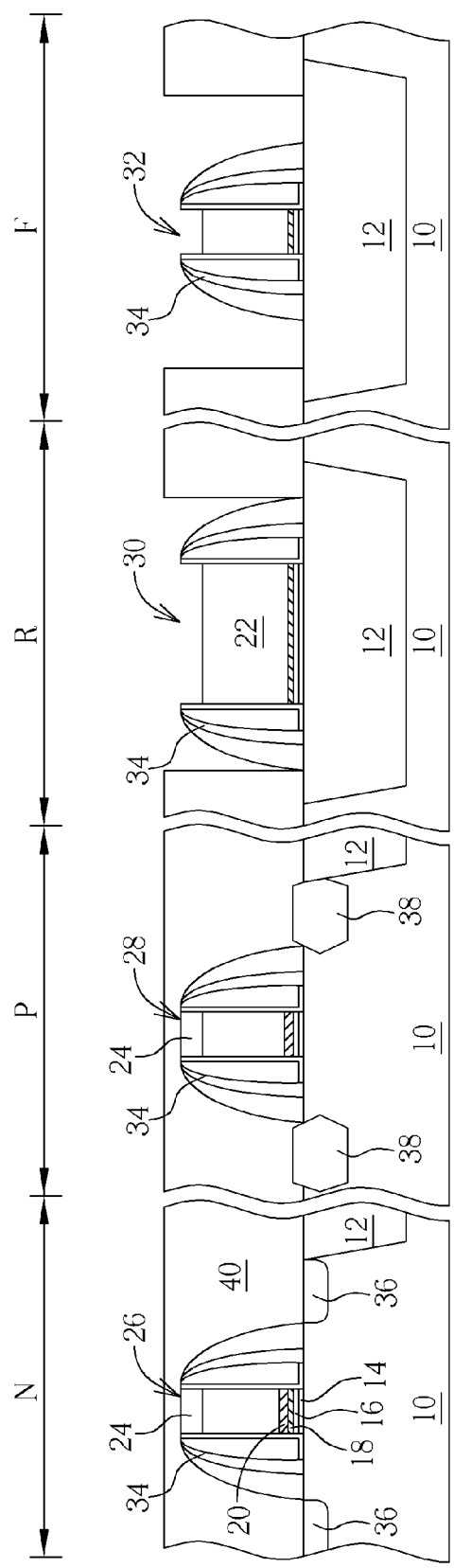

As shown in FIG. 2, the hard mask 24, the polysilicon layer 22, the work function layer 20, the capping layer 18, the high-K material layer 16 and the dielectric layer 14 are patterned to form an N-type polysilicon gate 26 in the N-type transistor region N, a P-type polysilicon gate 28 in the P-type transistor region P, a resistor 30 in the resistor region R and a efuse 32 in the efuse region F. Then, a spacer 34 is formed respectively on the N-type polysilicon gate 26, the P-type polysilicon gate 28, the resistor 30 and the efuse 32. The spacer 34 can be a single layer spacer or a multilayer spacer. In the present embodiment, the spacer 34 is shown as multilayered. A source/drain region 36, 38 is formed in the substrate 10 near the N-type polysilicon gate 26 and the P-type polysilicon gate 28 respectively. A strained silicon technology can also be used in the present embodiment to form tensile or compressive epitaxial silicon in the source/drain region 36, 38. For example, an epitaxial SiGe can be formed in the source/drain region 38 near the P-type polysilicon gate 28.

Then, a patterned mask 40, such as a photoresistor, is formed on the N-type transistor region N, the P-type transistor region P, the resistor region R and the efuse region F to expose the resistor 30 and the efuse 32. Subsequently, the hard mask 24 in the resistor 30 and in the efuse 30 is removed to expose the polysilicon 22 in the resistor 30 and the polysilicon 22 in the efuse 32.

Figure 3:
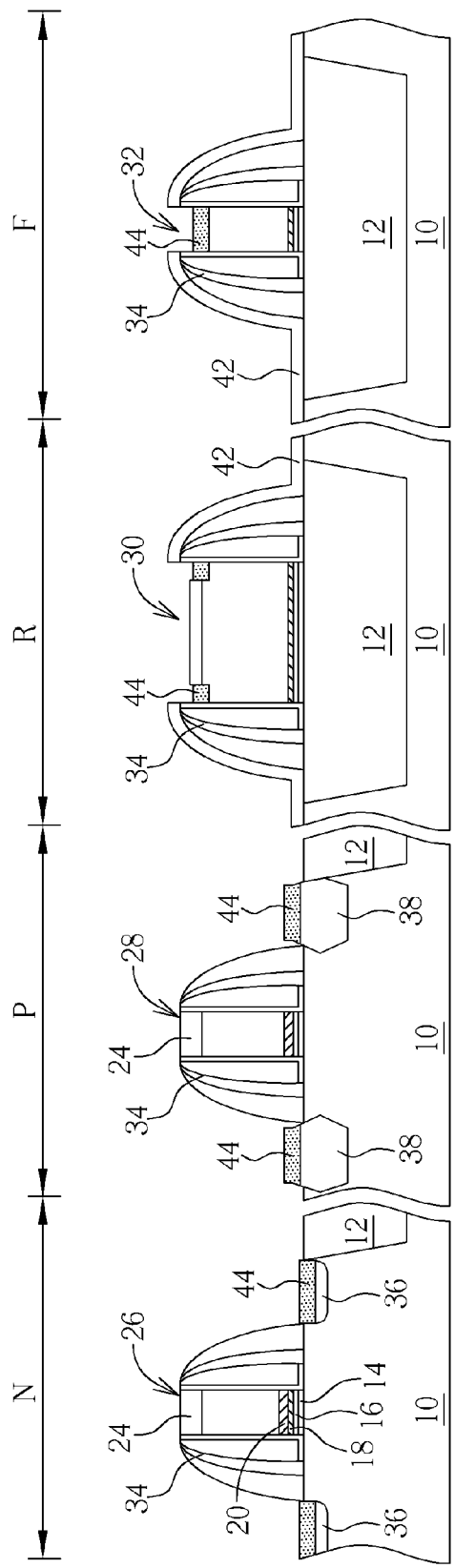

As shown in FIG. 3, the patterned mask 40 is removed. A patterned silicide block layer 42 is formed to cover the resistor region R and the efuse region F and expose the two sides of the polysilicon layer 22 in the resistor 30 and the top surface of the polysilicon layer 22 in the efuse 32. Later, a salicide process is performed to form a silicide layer 44 in the source/drain doping region 36, 38, the two sides of the polysilicon layer 22 in the resistor 30 and the top surface of the polysilicon layer 22 in the efuse 32.

Figure 4:
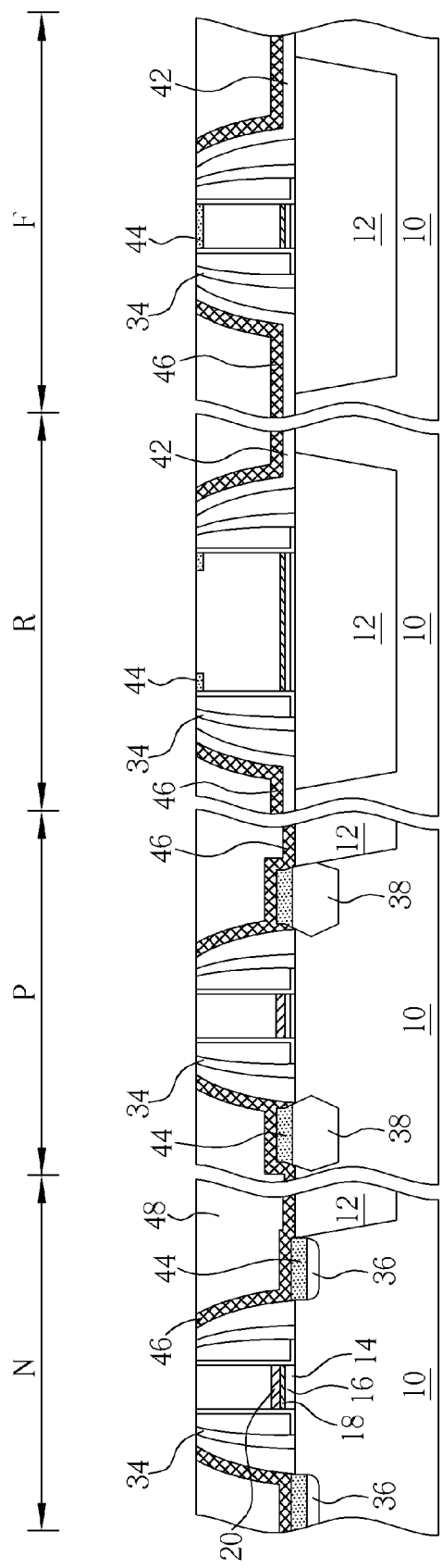

As shown in FIG. 4, an etching stop layer 46 such as silicon nitride is formed conformally on the substrate 10, the patterned silicide block layer 42, the N-type polysilicon gate 26, the P-type polysilicon gate 28, the resistor 30 and the efuse 32. A dielectric layer 48 is formed to cover the etching stop layer 46. Then, the dielectric layer 48 is planarized to expose the polysilicon layer 22 in the N-type polysilicon gate 26, the polysilicon layer 22 in the P-type polysilicon gate 28, the polysilicon layer 22 and the silicide layer 44 in the resistor 30 and the silicide layer 44 in the efuse 32. The method of planarizing the dielectric layer 48 could be a chemical mechanical polishing process. When the dielectric layer 48 is planarized, the hard mask 24 in the N-type polysilicon gate 26 and in the P-type polysilicon gate 28 is also removed.

Figure 5:
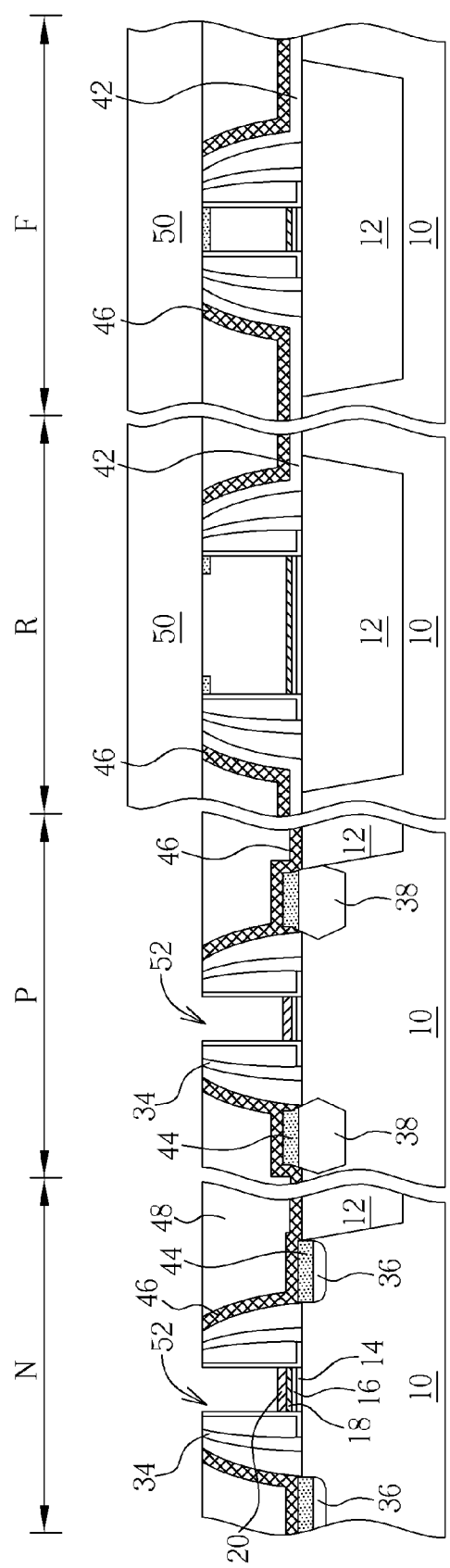

As shown in FIG. 5, a patterned mask 50 is formed to cover the resistor region R and the efuse region F and expose the N-type polysilicon gate 26 and the P-type polysilicon gate 28. The polysilicon layer 22 in the polysilicon gate 26 and in the P-type polysilicon gate 28 is removed to form a recess 52 in the N-type transistor region N and in the P-type transistor region P, respectively.

Figure 6:
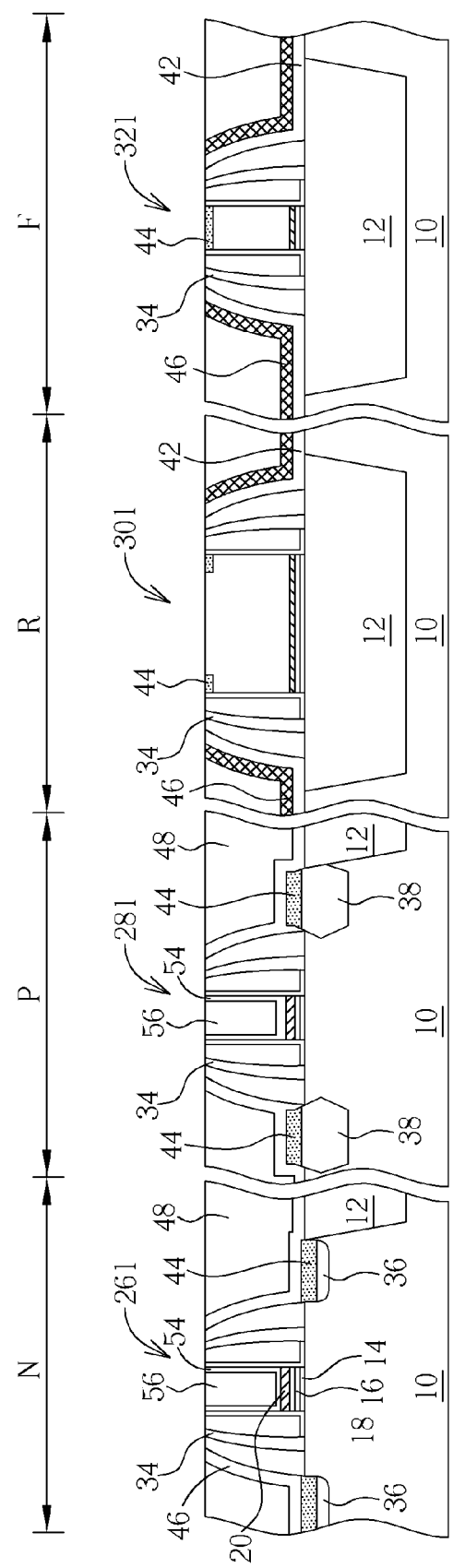

As shown in FIG. 6, the patterned mask 50 is removed. Then, a work function metal layer 54 is formed conformally to cover the dielectric layer 48, the spacer 34, the resistor 30, the efuse 32 and the sidewall and the bottom of the recess 52. A gate metal layer 56 is formed on the work function metal layer 54 and fills up the recess 52. Finally, the gate metal layer 56 and the work function metal layer 54 are planarized to be aligned with the surface of the dielectric layer 48, and the work function metal layer 54. During the planarizing, the gate metal layer 56 on the resistor 30 and on the efuse 32 are also removed and the polysilicon layer 22 and the silicide layer 44 is exposed. By this point the efuse structure 321, the resistor structure 301 and the metal gate transistor 261, 281 of the first preferred embodiment are finished.

Please refer to FIG. 1, and FIGS. 7 to 11. FIGS. 1, 7 to 11 depict a method of fabricating an efuse, a resistor and a transistor schematically according to the second preferred embodiment of the present invention. Elements with the same function will be designated with the same numeral. The difference between the first embodiment and the second embodiment is that: the gate metal layer is formed earlier than the silicide layer in the resistor in the second embodiment. Besides, in the second embodiment, the silicide layer in the source/drain doping region is not formed at the same step as the silicide layer in the resistor and the efuse. Moreover, in the first embodiment, the completed resistor and the efuse are both covered by the patterned silicide block layer.

As shown in FIG. 1, a substrate 10 having an N-type transistor region N, a P-type transistor region P, a resistor region R and an efuse region F is provided. A dielectric layer 14 and a high-K material layer 16 are formed on the N-type transistor region N, the P-type transistor region P, the resistor region R and the efuse region F in sequence. A capping layer 18 is formed on the N-type transistor region N, the resistor region R and the efuse region F. A work function metal layer 20 is formed on the high-K material layer 16 in the P-type transistor region P and the capping layer 18 in the N-type transistor region N. A polysilicon layer 22 and a hard mask 24 are formed in sequence on the work function metal layer 20 in the N-type transistor region N and the P-type transistor region P, and on the capping layer 18 in the resistor region R and the efuse region F.

Figure 7:
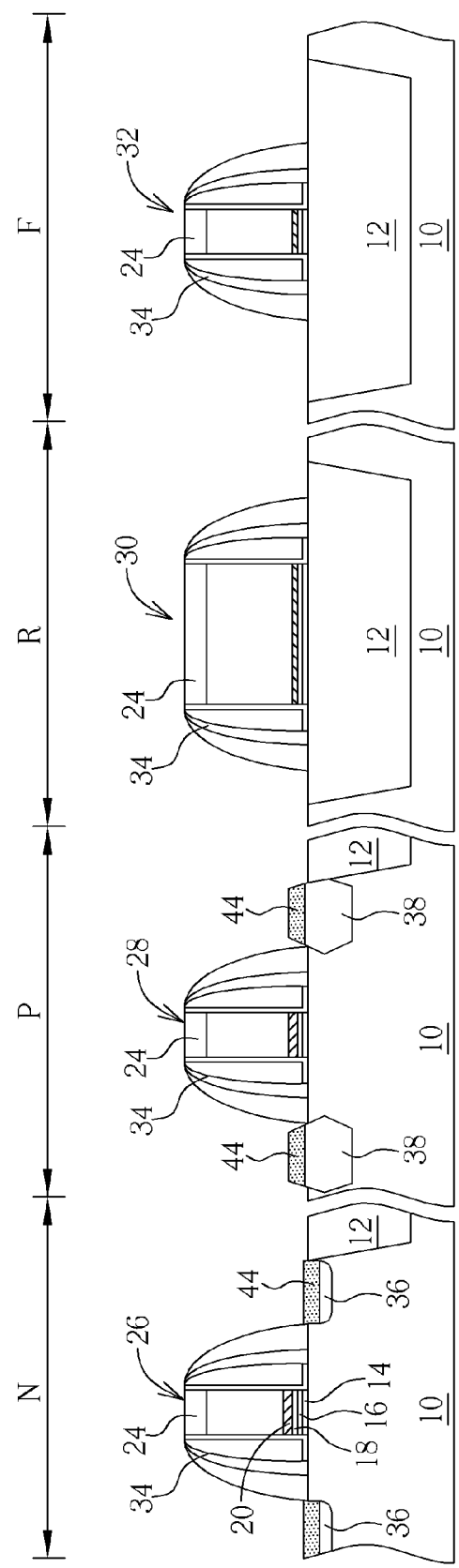
FIG. 7 to FIG. 11 depict a method of fabricating an efuse, a resistor and a transistor schematically according to the second preferred embodiment of the present invention.

As shown in FIG. 7, an N-type polysilicon gate 26 is formed in the N-type transistor region N, a P-type polysilicon gate 28 is formed in the P-type transistor region P, a resistor 30 is formed in the resistor region R and an efuse 32 is formed in the efuse region F. Then, a spacer 34 is formed respectively on the N-type polysilicon gate 26, the P-type polysilicon gate 28, the resistor 30 and the efuse 32. The spacer 34 can be a single layer spacer or a multilayered spacer. A source/drain region 36, 38 is formed in the substrate 10 near the N-type polysilicon gate 26 and the P-type polysilicon gate 28 respectively. An epitaxial SiGe can be formed in the source/drain region 38 near the P-type polysilicon gate 28. Then, a salicide process is performed to form a silicide layer 44 in the source/drain region 36, 38 respectively. During the salicide process, the polysilicon gate 26, 28, the resistor 30 and the efuse 32 are still covered with the hard mask 24, therefore, the silicide layer 44 will not form on the polysilicon layer 22 in the polysilicon gate 26, 28, the resistor 30, the efuse 32.

Figure 8:
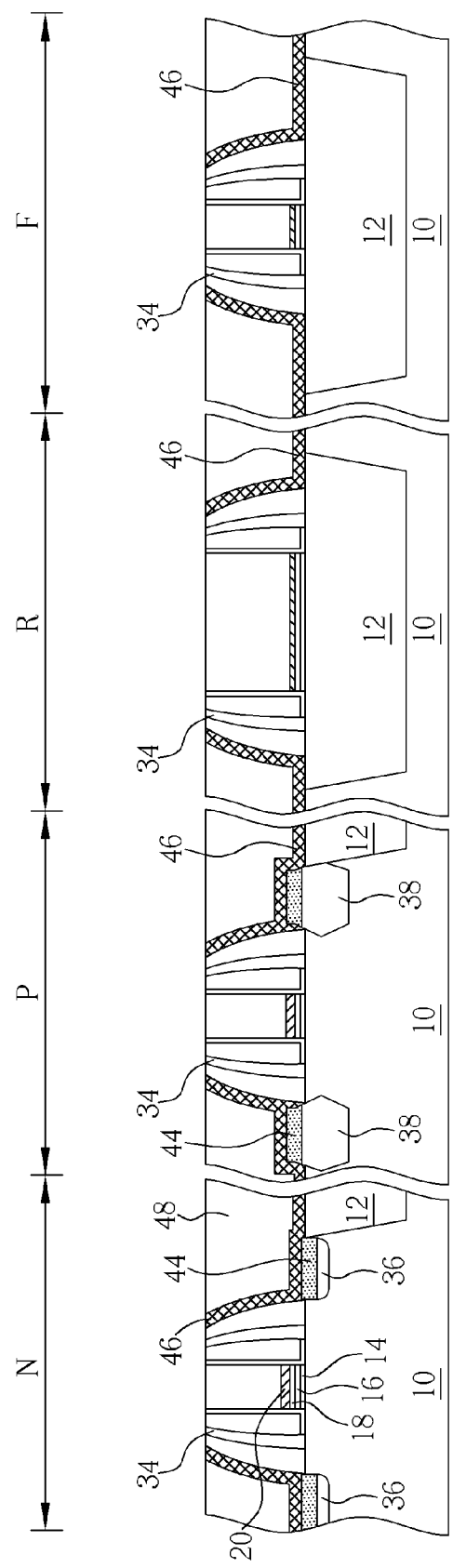

As shown in FIG. 8, an etching stop layer 46 such as silicon nitride is formed conformally on the substrate 10, the spacer 34, the N-type polysilicon gate 26, the P-type polysilicon gate 28, the resistor 30 and the efuse 32. A dielectric layer 48 is formed to cover the etching stop layer 46. Then, the dielectric layer 48 is planarized to expose the polysilicon layer 22 in the N-type polysilicon gate 26, the polysilicon layer 22 in the P-type polysilicon gate 28, the polysilicon layer 22 in the resistor 30 and the polysilicon layer 22 in the efuse 32. When the dielectric layer 48 is planarized, the hard mask 24 in the N-type polysilicon gate 26, the hard mask 24 in the P-type polysilicon gate 28, the hard mask 24 in the resistor 30 and the hard mask 24 in the efuse 32 are removed simultaneously.

Figure 9:
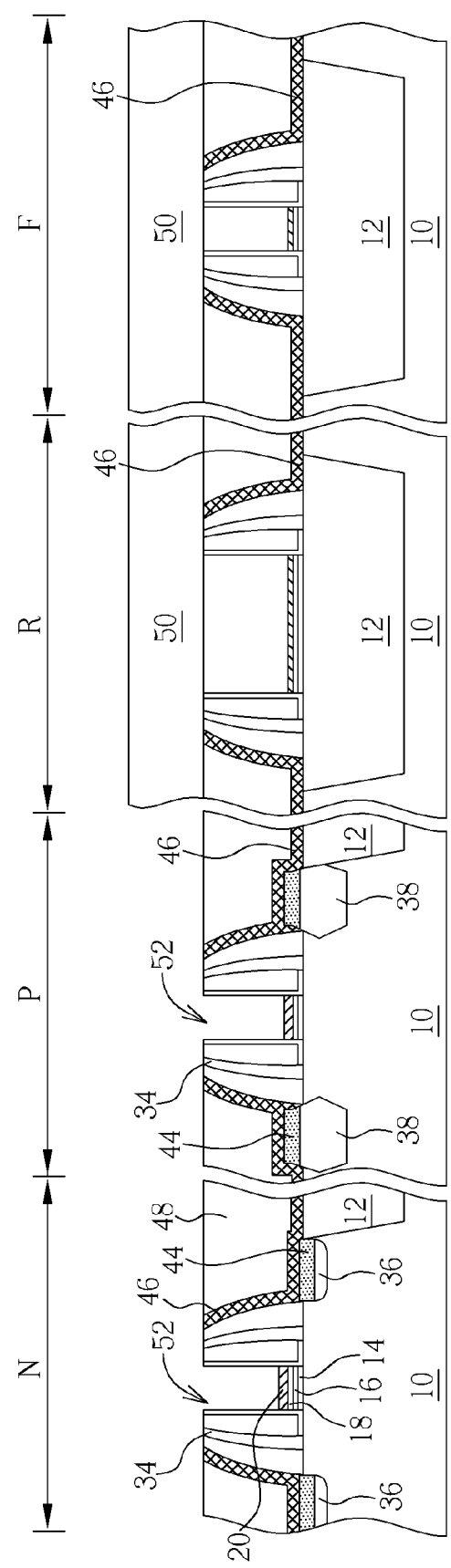

As shown in FIG. 9, a patterned mask 50, such as a photoresist layer is formed to cover the resistor region R and the efuse region F and expose the N-type polysilicon gate 26 and the P-type polysilicon gate 28. The polysilicon layer 22 in the polysilicon gate 26 and in the P-type polysilicon gate 28 is removed to form a recess 52 in the N-type transistor region N and in the P-type transistor region P, respectively.

Figure 10:
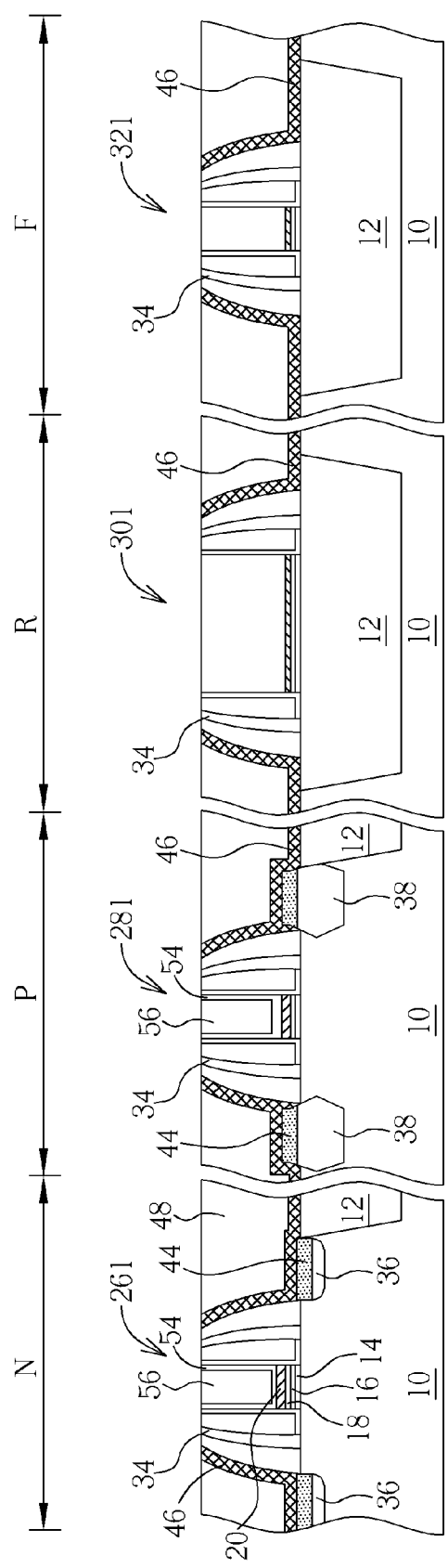

As shown in FIG. 10, the patterned mask 50 is removed. Then, a work function metal layer 54 is formed conformally to cover the dielectric layer 48, the spacer 34, the resistor 30, the efuse 32 and the sidewall and the bottom of the recess 52. A gate metal layer 56 is formed on the work function metal layer 54 and fills up the recess 52. Subsequently, the gate metal layer 56 and the work function metal layer 54 are planarized to be aligned with the surface of the dielectric layer 48, and the polysilicon layer 22 in the resistor 30 and the polysilicon layer 22 in the efuse 32 is exposed.

Figure 11:
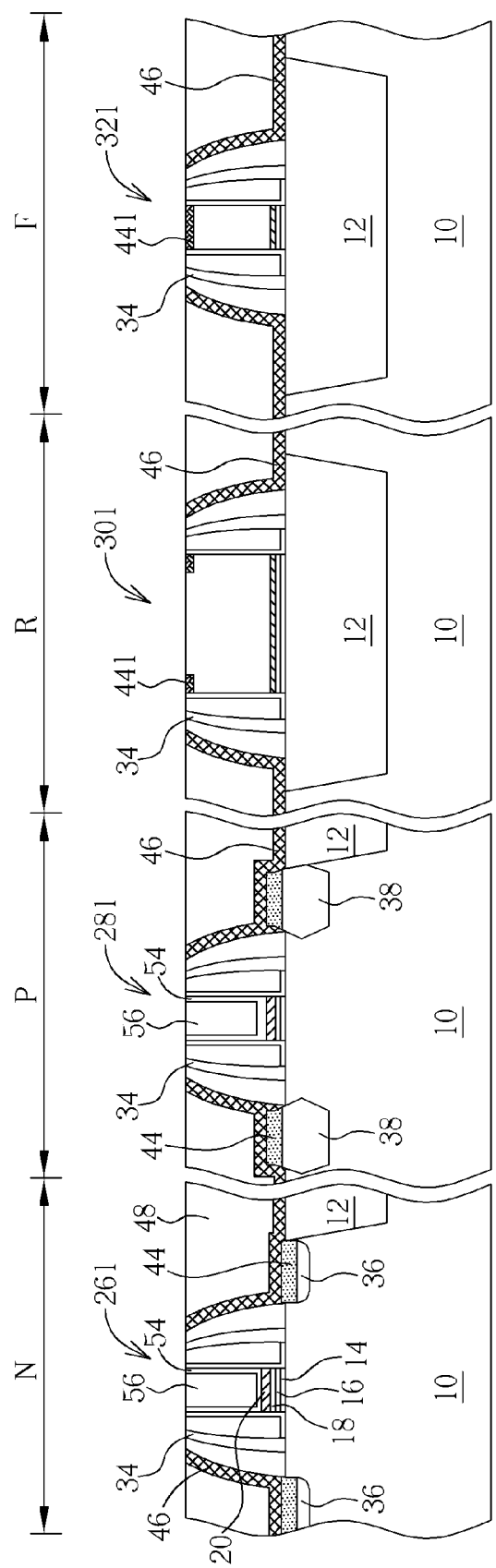

Please refer to FIG. 11. A patterned silicide block layer (not shown) is formed to cover the resistor region R and the efuse region F and expose the two sides of the polysilicon layer 22 in the resistor 30 and the top surface of the polysilicon layer 22 in the efuse 32. Later, a salicide process is performed to form a silicide layer 441 on the two sides of the polysilicon layer 22 in the resistor 30 and the top surface of the polysilicon layer 22 in the efuse 32. Finally, the patterned silicide block layer is removed. According to another preferred embodiment of the present invention, the patterned silicide block layer can be kept to serve as an interlayer dielectric layer in the following process. By this point the efuse structure 321, the resistor structure 301 and the metal gate transistor 261, 281 of the second preferred embodiment are finished.

After the efuse structure 321, the resistor structure 301 and the metal gate transistor 261, 281 of the first and second preferred embodiment are completed, a metal interconnection can be formed. For, example, another dielectric layer can be formed on the N-type transistor region N, the P-type transistor region P, the resistor region R and the efuse region F. Then, a plurality of contact plugs can be formed in the aforesaid dielectric layer to electrically connect to the source/drain doping region, the metal gates, the silicide layer at two sides of the resistor and the silicide layer at the efuse, respectively. A plurality of wires can be formed to connect the contact plugs.

Those skilled in the art will readily observe that numerous modifications and alterations of the device and method may be made while retaining the teachings of the invention.

What is claimed is:

1. A method of fabricating an efuse, a resistor and a transistor comprising:
    providing a substrate;
    forming a transistor gate, a resistor, and an efuse on the substrate, wherein the transistor gate, the resistor and the efuse together comprise a first dielectric layer, a polysilicon layer, a hard mask;
    forming a source/drain doping region in the substrate near the transistor gate;
    removing the hard mask in the resistor and in the efuse;
    performing a salicide process to form a silicide layer in the source/drain doping region, the resistor and the efuse, respectively;
    forming a planarized second dielectric layer on the substrate, and exposing the polysilicon in the transistor gate, in the resistor and in the efuse;
    removing the polysilicon in the transistor gate to form a recess; and
    forming a metal layer filling up the recess.

2. The method of fabricating an efuse, a resistor and a transistor of claim 1, further comprising:
    before forming the source/drain doping region, forming a spacer on the transistor gate, the resistor and the efuse, respectively.

3. The method of fabricating an efuse, a resistor and a transistor of claim 1, further comprising:
    before performing the salicide process, forming a silicide block layer on the substrate, and the center of the polysilicon in the resistor.

4. The method of fabricating an efuse, a resistor and a transistor of claim 3, wherein the silicide layer is on both sides of the polysilicon in the resistor and on the top surface of the polysilicon in the efuse.

5. The method of fabricating an efuse, a resistor and a transistor of claim 1, further comprising:
    before forming the second dielectric layer, forming an etching stop layer on the transistor gate, the resistor, the efuse and the substrate conformally.

6. The method of fabricating an efuse, a resistor and a transistor of claim 1, wherein the first dielectric layer comprises a material with a high electric constant.

7. The method of fabricating an efuse, a resistor and a transistor of claim 1, wherein the metal layer comprises a work function metal layer and a gate metal layer.

8. The method of fabricating an efuse, a resistor and a transistor of claim 7, wherein the step of forming the metal layer comprises:
    forming the work function metal layer on the second dielectric layer and the recess conformally; and
    forming the gate metal layer on the work function metal layer and filling up the recess.

* * * * *